United States Patent
Horsley et al.

(10) Patent No.: US 9,891,290 B2
(45) Date of Patent: Feb. 13, 2018

(54) OFFSET SUPPRESSION IN MICROMACHINED LORENTZ FORCE MAGNETIC SENSOR BY CURRENT CHOPPING

(71) Applicant: THE REGENTS OF THE UNIVERSITY OF CALIFORNIA, Oakland, CA (US)

(72) Inventors: David Horsley, Albany, CA (US); Mo Li, Davis, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 20 days.

(21) Appl. No.: 15/171,805

(22) Filed: Jun. 2, 2016

(65) Prior Publication Data
US 2017/0059666 A1   Mar. 2, 2017

Related U.S. Application Data

(63) Continuation of application No. PCT/US2014/068404, filed on Dec. 3, 2014.

(60) Provisional application No. 61/911,087, filed on Dec. 3, 2013.

(51) Int. Cl.
G01R 33/02 (2006.01)
G01R 33/00 (2006.01)
G01R 33/038 (2006.01)

(52) U.S. Cl.
CPC ..... *G01R 33/0017* (2013.01); *G01R 33/0041* (2013.01); *G01R 33/0385* (2013.01)

(58) Field of Classification Search
CPC ... G01V 3/28; G01R 33/0017; G01R 33/0041
USPC .................................................. 324/225, 244
See application file for complete search history.

(56) References Cited

U.S. PATENT DOCUMENTS

| 4,663,590 | A | 5/1987 | Gershenson et al. |
| 9,664,750 | B2* | 5/2017 | Thompson ......... G01R 33/0286 |
| 2005/0030115 | A1 | 2/2005 | Richards et al. |
| 2009/0015250 | A1 | 1/2009 | Sunier |
| 2012/0176129 | A1* | 7/2012 | Seeger ................. G01R 33/038 |
|  |  |  | 324/252 |
| 2013/0180331 | A1 | 7/2013 | Caminada et al. |
| 2014/0049256 | A1* | 2/2014 | Smith ................... B81B 3/0032 |
|  |  |  | 324/259 |

OTHER PUBLICATIONS

United States Patent and Trademark Office (USPTO), international search report and written opinion, PCT international application No. PCT/US2014/068404, dated Mar. 16, 2015, pp. 1-13, with claims searched, pp. 14-18.

* cited by examiner

*Primary Examiner* — Reena Aurora
(74) *Attorney, Agent, or Firm* — O'Banion & Ritchey LLP; John P. O'Banion

(57) ABSTRACT

Offsets (short and long term) are significantly reduced in a Lorentz force magnetometer circuit. A modulated bias current supplied to the magnetometer is chopped by periodically switching its polarity. Magnetometer output is demodulated, then de-chopping performed to restore signal polarity output. Chopping of the bias current signal polarity modulates magnetic field signal to a frequency in which electrostatic force remains constant toward eliminating offset and long-term drift from said micromechanical resonator.

20 Claims, 11 Drawing Sheets

OFFSET SUPPRESSION IN MICROMACHINED LORENTZ FORCE MAGNETIC SENSOR BY CURRENT CHOPPING

CROSS-REFERENCE TO RELATED APPLICATIONS

This application is a 35 U.S.C. § 111(a) continuation of PCT international application number PCT/US2014/068404 filed on Dec. 3, 2014, incorporated herein by reference in its entirety, which claims priority to, and the benefit of, U.S. provisional patent application Ser. No. 61/911,087 filed on Dec. 3, 2013, incorporated herein by reference in its entirety. Priority is claimed to each of the foregoing applications.

The above-referenced PCT international application was published as PCT International Publication No. WO 2015/084980 on Jun. 11, 2015, and republished on Sep. 17, 2015, which publications are incorporated herein by reference in their entireties.

STATEMENT REGARDING FEDERALLY SPONSORED RESEARCH OR DEVELOPMENT

This disclosed material was made with Government support under Grant No. 0846379, awarded by the National Science Foundation. The Government has certain rights in this invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technological Field

This technical disclosure pertains generally to magnetic direction sensors, and more particularly to overcoming offset issues with Lorentz force magnetic sensors.

2. Background Discussion

Ongoing efforts are being made toward improving both the sensitivity and direction resolution of magnetic sensors. The Lorentz force magnetic sensor is an emerging technology for magnetic sensors, and Lorentz force sensors with sensitivity and resolution comparable to, or better than, that of Hall-effect sensors have been reported recently. Compared to anisotropic magnetoresistive (AMR) and Hall-effect sensors that are commonly used in portable electronics, the Lorentz force sensor has the advantage that it is free of magnetic material, whereby it is potentially CMOS compatible, while its lack of magnetic material result in its being free of magnetic hysteresis. A Lorentz force sensor can also be co-fabricated with other MEMS (micro-electromechanical systems) inertial sensors, such as accelerometers and gyroscopes.

Offset is another key parameter that influences the performance of magnetic sensors. Offset reduces the dynamic range of the system and also results in drift error, which directly transfers to heading error when the sensor is used as a compass. It should be appreciated that there are three general categories of compasses: (1) cardinal points, (2) heading/orienteering, and (3) navigation. For cardinal points, the compass is used to provide eight major directions (N, NE, E, SE, S, SW, W, NW). The required resolution for this application is 10 µT with a heading accuracy of at least 22.5°. The second category of heading/orienteering is the type of compasses mainly used in portable devices, such as smart phones and tablets. The required resolution is 500 nT and heading accuracy is 1°. A 1 µT drift error in the sensor output may result in more than 1° error in azimuth determination. In the last category, compasses for navigation, provide a resolution of better than 50 nT, and with 0.1° heading accuracy. Flux-gate magnetometers and AMR magnetometers are the common sensors in this category due to their lower noise. Methods of reducing the offset and drift error for Hall-effect sensors and AMR sensors have been reported.

However, offset and offset instability in the Lorentz force sensor has not been well-studied as yet. Kyynäräinen et al. reported a stability measurement conducted over 120 hours and observed a 1% (±10 000 ppm) variation in the sensor's output. In previous work of the Applicant, Allan deviation was utilized as a measure of the random variation of offset as a function of averaging time. Both of the above works indicated that despite the low short-term noise of the Lorentz force sensor, long-term drift is a problem when using this sensor as an electronic compass.

Accordingly, apparatus and methods are described in the present disclosure for overcoming drift when using Lorentz force sensors.

BRIEF SUMMARY

A method and apparatus are disclosed for suppressing offset in micromachined Lorentz force magnetic sensors by a process of chopping the Lorentz force bias current. By switching the polarity of the Lorentz force bias current, the sensitivity of the magnetic sensor alternates its sign whereas the offset remains the same. The inventive method significantly reduces long-term drifting of the magnetic sensor.

Further aspects of the presented technology will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The disclosed technology will be more fully understood by reference to the following drawings which are for illustrative purposes only:

DETAILED DESCRIPTION

A method and apparatus is disclosed for suppressing the offset and reducing the offset instability in micromachined Lorentz force magnetic sensors. The disclosed mechanism is suitable for use in all Lorentz force magnetic sensors operating under the same principle.

I. THE CURRENT CHOPPING METHOD

A. Basic Principle of a Lorentz Force Magnetometer

Figure 1A:
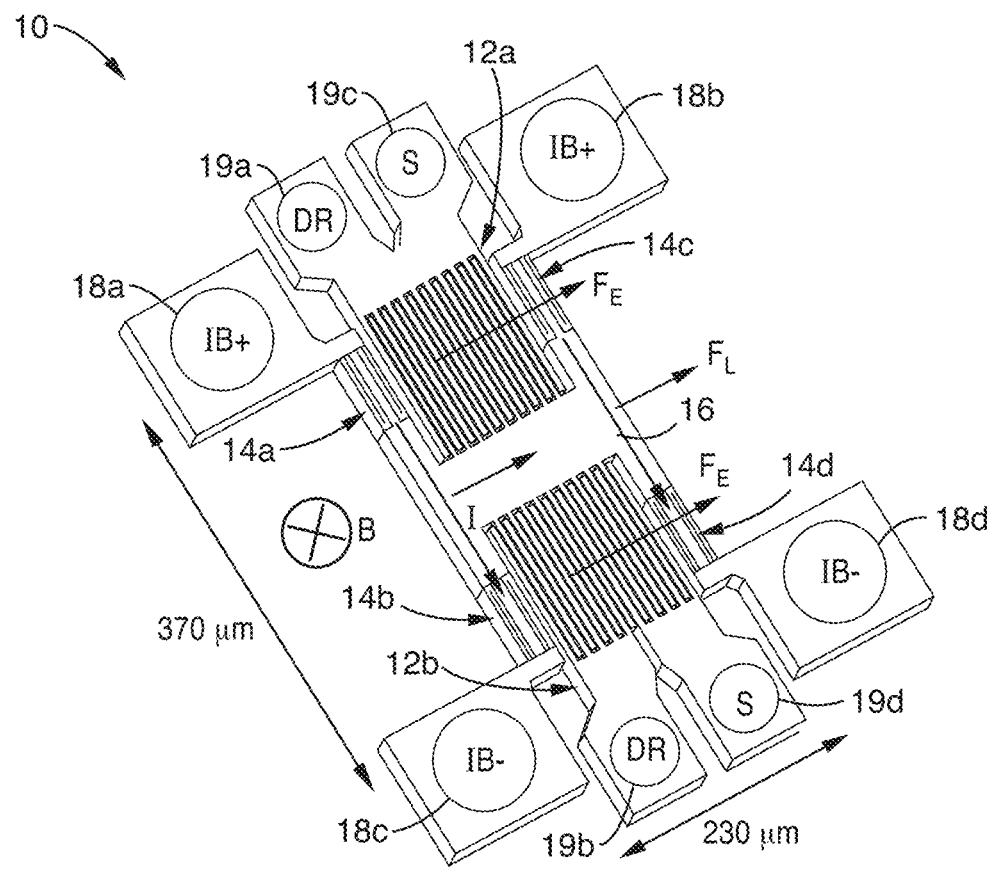
FIG. 1A is a pictorial view of a Lorentz force magnetometer which is utilized according to at least one embodiment of the present disclosure.

FIG. 1A illustrates an example embodiment 10 of a Lorentz force magnetometer, in which the Lorentz force is modulated at the mechanical resonance frequency $f_n$ of the proof-mass. The example magnetometer shown has an $f_n$ of 105.51 kHz, a Q of 13,000, $R_{IB}$ of 155 ohms (Ω), a device thickness of 40 μm, a width of 230 μm, and a length of 370 μm. It will be recognized that the present disclosure is not limited to devices having these specific characteristics, or dimensions.

Parallel plates 12a and 12b are used for electrostatic sensing and electrostatic driving, respectively, of a proof mass 16 suspended by a plurality of folded springs, 14a, 14b, 14c and 14d that define the spring constant of the resonator. Electrodes 18a and 18b are positive side current biasing electrodes (IB+) electrodes, while electrodes 18c and 18d comprise negative side bias current (IB−) electrodes. A bias current is injected from electrodes 18a and 18b, which flows through proof mass 16 and out of electrodes 18c and 18d. Electrodes 19a and 19b are DR electrodes utilized for applying an electrostatic drive signal, while electrodes 19c and 19d are S electrodes that are utilized for electrostatic sensing.

Figure 1B:
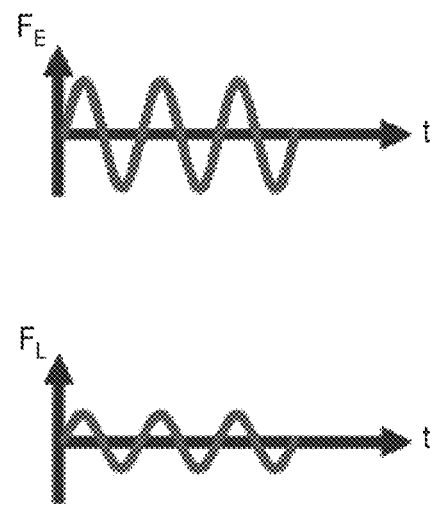
FIG. 1B is a plot of electrostatic force $F_E$ and the resulting amplitude modulated (AM) Lorentz force $F_L$ in the Lorentz force sensor of FIG. 1A utilized according to at least one embodiment of the present disclosure.

FIG. 1B depicts electrostatic force $F_E$ and the resulting amplitude modulated (AM) Lorentz force $F_L$ in the Lorentz force sensor of FIG. 1A. It will be seen that the forces shown are substantially in-phase.

Similar to an accelerometer or a gyroscope, a Lorentz force sensor is a force sensor that measures displacement resulting from the Lorentz force $F_L$ on a current-carrying proof-mass. The current is modulated at the first flexural mode of the structure at frequency $f_n$, which modulates the low frequency magnetic field B up to near $f_n$, resulting in an amplitude modulated (AM) Lorentz force $F_L$. In a compass application, the magnetic field of the Earth is constant but varies slowly as the compass heading changes, resulting in a displacement amplitude given by:

$$x_L = \frac{F_L Q}{k} = \frac{BiLQ}{k} \quad (1)$$

where B is the magnetic field, i is the Lorentz force bias current, L is the effective length of the current-carrying resonator, Q is the mechanical quality factor and k is the stiffness of the flexures that support the proof-mass.

The reference frequency for the bias current can be provided either by using an external oscillator with its frequency set to the resonance frequency of the magnetometer (i.e., open-loop), or by using a magnetometer itself as an oscillator (i.e., closed-loop). In closed-loop operation, a self-sustained oscillation loop is formed using the Lorentz force magnetometer as a resonator. Electrodes DR and S are used for electrostatic driving and capacitive sensing, respectively, and a sustaining amplifier is configured for maintaining a constant electrostatically-excited displacement amplitude $x_E$. Operating the magnetometer in closed-loop provides improved stability over temperature while additionally reducing system complexity. However, closed-loop operation introduces a large offset ($x_E$) in the oscillation amplitude, which can be 100× larger than the amplitude generated by the Lorentz force ($x_L$).

When the electrostatic force is in phase with the Lorentz force, at steady state, the total oscillation amplitude of the magnetometer can be expressed as:

$$x = x_E + x_L = \underbrace{V_{DC} V_{AC} \frac{dC}{dx} \frac{Q}{k}}_{x_E} + \underbrace{BiL \frac{Q}{k}}_{x_L} \quad (2)$$

where $V_{DC}$ is the DC bias, $V_{AC}$ is the electrostatic driving voltage, and dC/dx is the capacitive displacement sensitivity. It should be noted that both $V_{AC}$ and i have a frequency of $f_n$. Eq. (2) makes it clear that $x_E$ appears as offset in the AM output. As a result, the offset from the micromechanical resonator introduces long-term sensor output drift, including 1/f, $1/f^2$ and $1/f^3$ noise.

B. Basic Principle of Current Chopping

Conceptually, the current chopping method modulates the magnetic field signal to a frequency where offset and long-term drift from the micromechanical resonator are eliminated. This can be achieved by periodically reversing the sign of the magnetic field sensitivity, whereas the offset from the electrostatic force remains constant. This is achieved by reversing the bias current in response to introducing a 180° phase shift between the Lorentz current and the electrostatic drive signal, this flips the direction of the Lorentz force relative to the electrostatic force (assuming a constant magnetic field is applied).

Figures 2A, 2B:
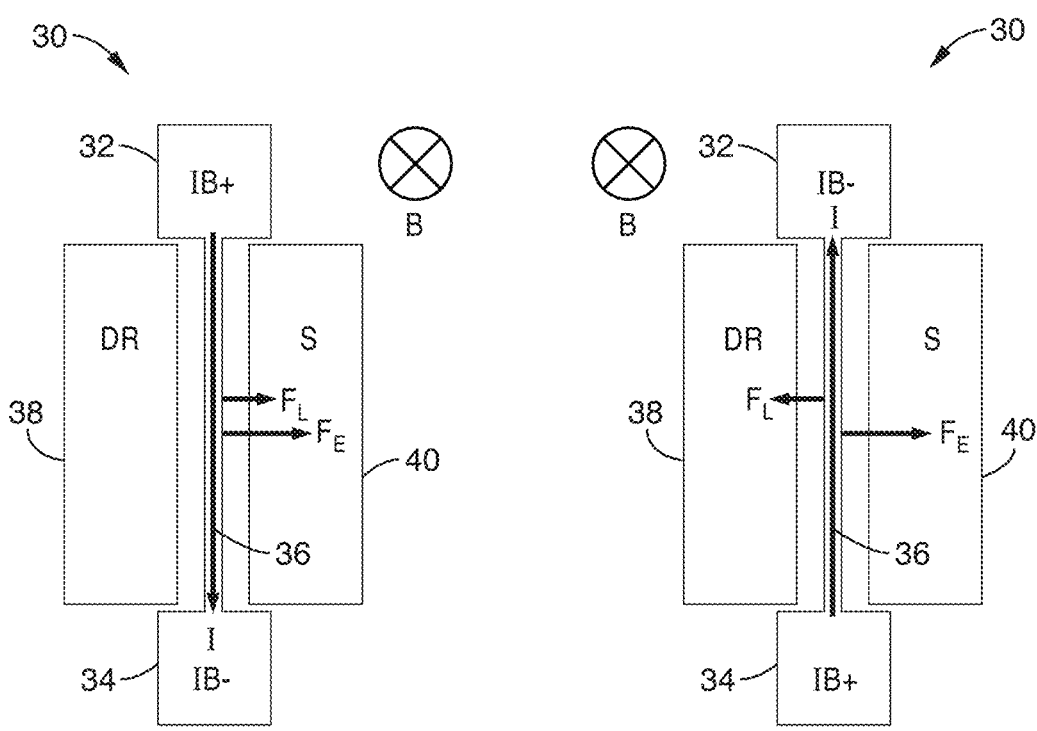
FIG. 2A and FIG. 2B are schematic models of current chopping, showing positive and negative sensitivity, according to at least one embodiment of the present disclosure.

FIG. 2A and FIG. 2B depict current reversing in a Lorentz force sensor 30. Electrodes 32, 34 are seen on either end of current carrying resonator 36, with electrostatic driving (DR) 38 and sensing (S) 40 electrodes. In response to a first current direction seen in FIG. 2A, in which electrode 32 is at voltage IB+, and electrode 34 at voltage IB−, the Lorentz force and the electrostatic force have the same sign. While in FIG. 2B, an opposite current direction is seen through the resonator 36, resulting in the Lorentz force and the electrostatic force having opposing signs.

When the Lorentz force and the electrostatic force have the same sign, as shown in FIG. 2A, the oscillation amplitude is:

$$x_+ = x_E + x_L = \left(V_{DC} V_{AC} \frac{dC}{dx} + BiL\right)\frac{Q}{k} \quad (3)$$

whereas when the Lorentz force is reversed, as shown in FIG. 2(b), the oscillation amplitude is:

$$x_- = x_E - x_L = \left(V_{DC} V_{AC} \frac{dC}{dx} - BiL\right)\frac{Q}{k}. \quad (4)$$

By sampling the oscillation amplitudes for these two cases and subtracting them from each other at the steady state (e.g., utilizing sample and hold circuits in the analog domain, or by sampling and analyzing the data in digital domain, or other techniques without limitation), the difference in oscillation amplitude is:

$$x_d = x_+ - x_- = 2BiL\frac{Q}{k} \quad (5)$$

The sensitivity is given by:

$$S_x = \frac{\partial x_d}{\partial B} = 2iL\frac{Q}{k} \quad (6)$$

The sensitivity is doubled and the offset from electrostatic force is removed. It will be noted that when the sensor operates continuously with current chopping, the resultant sensitivity is half of $S_x$ due to the dechopping stage, as discussed below.

Figure 3A:
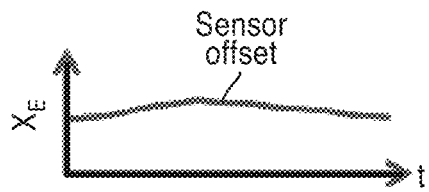
FIG. 3A through FIG. 3F are plots of sensor offset, and magnetic field signal and their combination, operating without and with current chopping according to at least one embodiment of the present disclosure.
Figure 3D:
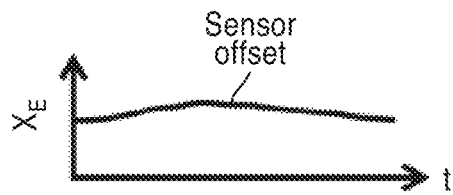
Figure 3B:
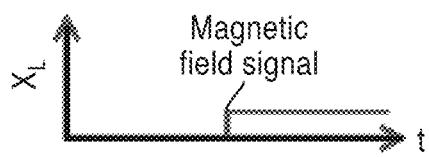
Figure 3E:
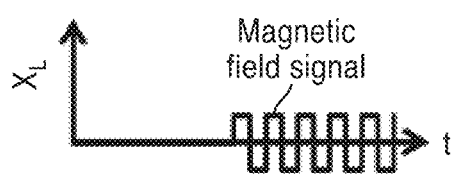
Figure 3C:
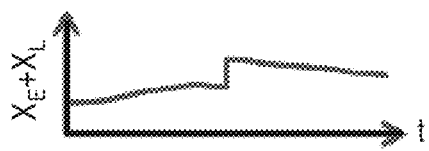

FIG. 3A through FIG. 3F illustrate offset amplitude $x_E$, the amplitude from magnetic field signal $x_L$ and the total oscillation amplitude $x_E + x_L$ in the time domain. It is assumed that the input magnetic field starts at 0 and changes to a constant DC value at an arbitrary time. From the plot sequence of FIG. 3A through FIG. 3C it can be observed that the sensor offset $x_E$ (FIG. 3A) and magnetic signal $x_L$ (FIG. 3B) are not separated from each other without current chopping, thus they cannot be readily separated from each other in the final oscillation amplitude $x_E + x_L$ (FIG. 3C).

Figure 3F:
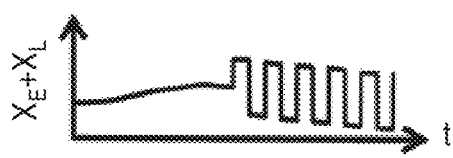

However, in the plot sequence of FIG. 3D through FIG. 3F, sensor offset $x_E$ (FIG. 3D) is the same, while magnetic field signal $x_L$ (FIG. 3E) is a modulated signal with twice the amplitude observed in FIG. 3B, whereby sensor offset and field signals are more readily discerned (FIG. 3F). It will be appreciated that an extra dechopping step at the output of the sensor separates $x_E$ from $x_L$, returning the chopped magnetic field signal to the baseband with minimal offset.

In the frequency domain, two modulation and two demodulation steps are involved. Before modulation, the magnetic field signal and the 1/f noise from the detection electronics are in baseband.

Figure 4A:
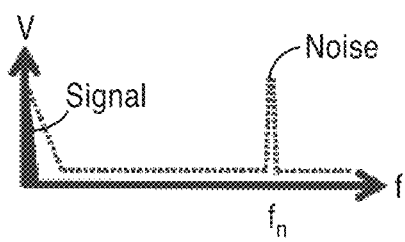
FIG. 4A through FIG. 4D are plots of spectra comparisons in regard to chopping and dechopping according to at least one embodiment of the present disclosure.
Figure 4B:
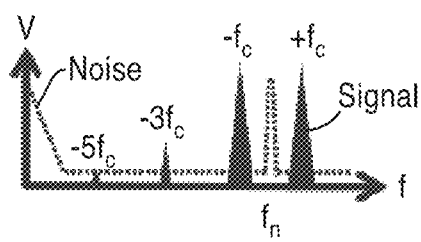

FIG. 4A through FIG. 4D depict the $1/f$, $1/f^2$ and $1/f^3$ noise terms from the micromechanical resonator centered at the natural frequency of the resonator at $f_n$. In FIG. 4A a first modulation is seen occurring when the Lorentz force is generated by an AC bias current $i \cos(2\pi f_n)$, which is a method commonly used in resonant Lorentz force magnetometers. The magnetic signal is free of 1/f noise from the front-end detection electronics and the motion resulting from the magnetic signal is amplified by the Q of the resonator, which can be higher than 10,000 for resonators in vacuum. In FIG. 4B a second modulation is seen when the AC bias current reverses its sign at a much lower chopping frequency $f_c$, which is typically in the range from a few Hz to tens of Hz, so the magnetic field signal is modulated to $\pm nf_c$ sidebands centered at $f_n$. It will be noted that n is an odd integer, as seen in the figure. As discussed later, n=1 is the dominant frequency component in the chopped output spectrum.

Figure 4C:
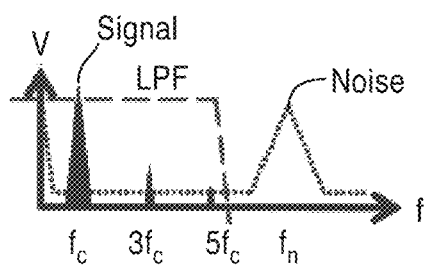
Figure 4D:
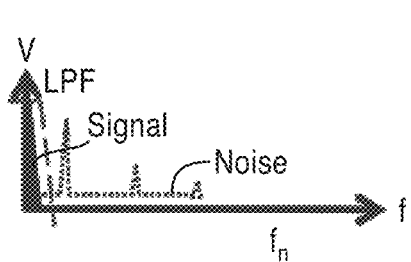

Since the first two modulation steps are applied to the excitation current, which is independent from the electrostatic force, the offset due to electrostatic excitation is not modulated and remains centered at $f_n$. The output of the magnetometer is then demodulated at $f_n$. During this demodulation, the magnetic signal centered at $f_n$ is demodulated back to $nf_c$ and the offset is demodulated back to baseband, whereas the 1/f noise from the detection electronic is modulated to $f_n$, as shown in FIG. 4C. A low-pass filter can be preferably utilized here to filter out the noise and harmonics at higher frequencies. The final chopping stage recovers the magnetic signal to the baseband, whereas the offset of the magnetometer is modulated to $nf_c$ as shown in FIG. 4D.

To avoid aliasing, the current chopping method limits the frequency of the input magnetic field to $f_c/2$. The upper bound of the chopping frequency $f_c$ is set by the bandwidth of the mechanical resonator. By way of example and not limitation, in this disclosure the bandwidth of the mechanical resonator is 4 Hz. During at least one of our tests, $f_c$ was set to 1 Hz, which limits the bandwidth of the sensor system to 0.5 Hz. For compass applications, a bandwidth of 5 to 10 Hz is required. In order to achieve this requirement in the future, a mechanical resonator with a bandwidth larger than 20 Hz should be utilized. The bandwidth of the mechanical resonator is given by:

$$BW = \frac{f_n}{2Q} = \frac{b}{4\pi m} \quad (7)$$

where b is the damping coefficient and m is the modal mass. The bandwidth can be enhanced by increasing b or decreasing m. The former can be easily implemented by increasing the pressure inside a vacuum package to introduce more squeeze film gas damping, however this would result in smaller sensitivity and worse resolution as a trade-off. The latter can be achieved by optimizing the resonator design.

II. MEASUREMENT

A single-axis Lorentz force magnetometer is used to demonstrate the current chopping method. The example magnetometer was fabricated in the epi-seal encapsulation process, although the disclosure is not limited to a magnetometer fabricated in this manner.

Figure 5A:
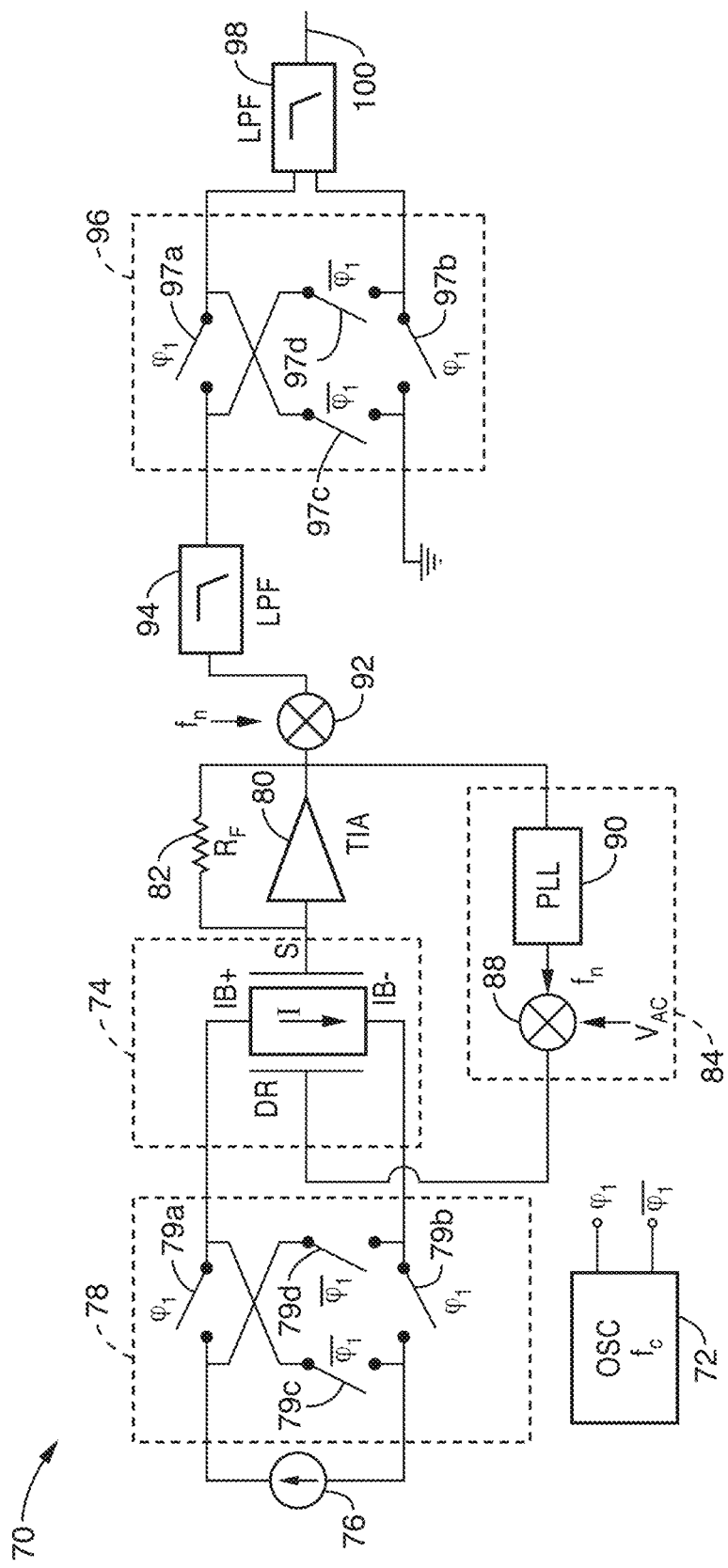
FIG. 5A is a schematic block diagram of current chopping operation of a first magnetometer according to at least one embodiment of the present disclosure.
Figure 5B:
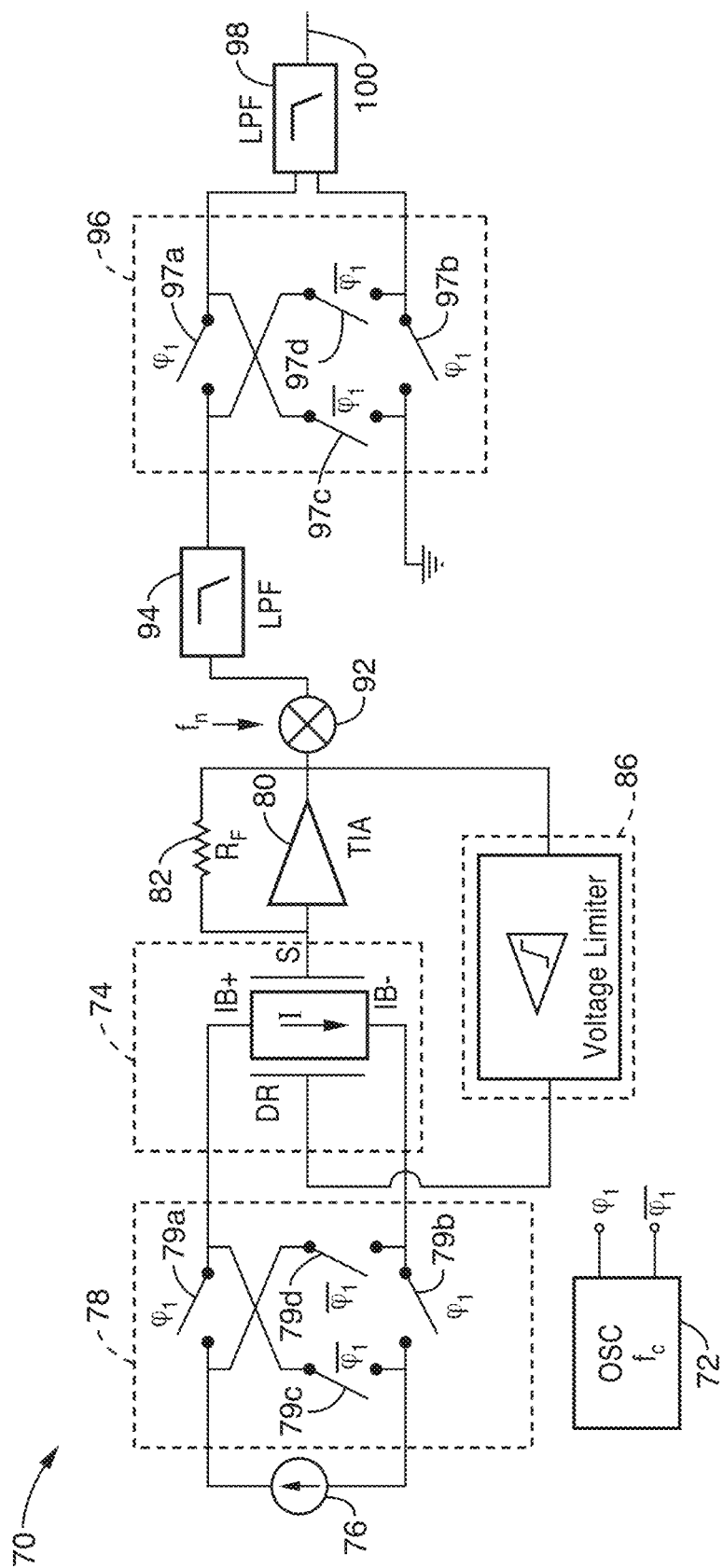
FIG. 5B is a schematic block diagram of current chopping operation of a second magnetometer according to at least one embodiment of the present disclosure.

FIG. 5A and FIG. 5B illustrates block diagram 70 of two variations of the current chopping operation. In FIG. 5A an oscillator is seen 72 configured to provide a chopping frequency $f_c$ with outputs $\varphi 1$ and $\overline{\varphi 1}$. A bias current generator modulated at the natural frequency (e.g., first flexural mode) $f_n$ 76 is seen coupled through a first "chopper" 78. The "chopper" is configured to reverse the polarity of output from the bias current generator to the magnetometer, and is exemplified as having four switches 79a, 79b, 79c and 79d, (e.g., solid state electronic switches) with two in series and two forming crossover parallel paths. The states of chopper switching are controlled (driven) by outputs $\varphi 1$ and $\overline{\varphi 1}$ of oscillator 72. Bias current output 76 which is chopped through chopper switches 78 is coupled to current inputs (e.g., IB+, IB−) of a magnetometer 74. Coupled to the sense side (S) of the magnetometer is a trans-impedance amplifier (TIA) 80 with a feedback path 82 (i.e., resistor $R_F$) setting its trans-impedance gain.

By way of example, in this implementation, the trans-impedance amplifier and bias current generation circuits were implemented on a PCB, while the other blocks were implemented using a digital lock-in amplifier (e.g., Zurich Instruments® HF2-LI) controlled by a customized Matlab® program.

The micromachined resonator 74 is first put into an oscillation loop to generate a bias current at the natural frequency $f_n$. In this example, a phased locked loop (PLL) 90 is seen utilized with a mixer (modulator) 88 (receiving $f_n$ and $V_{AC}$) to sustain oscillation of the magnetometer. Oscillation offset $x_E$ is thus set by the electrostatic driving voltage $V_{AC}$. The oscillation amplitude at the output of the trans-impedance amplifier is demodulated at the natural frequency $f_n$ at a demodulator 92, and passed through a low-pass filter 94 to filter out the harmonics introduced during demodulation.

To perform current chopping and de-chopping, a second chopper 96 is included in the system with switches whose state is controlled by control signals $\varphi 1$ and $\overline{\varphi 1}$ generated by an additional oscillator (not shown). This second chopper 96 is also exemplified here as a set of four switches 97a, 97b, 97c and 97d, (e.g., two in series and two forming crossover parallel paths). An additional low pass filter 98 is also utilized after the de-chopping stage to output a final filtered output 100. The final output amplitude is sampled and recorded after it reaches steady state. The signal is de-chopped at $f_c$ and then the magnetic signal is recovered to baseband. During all measurements, a 0.9 mA bias current driven through the 155 proof-mass results in 125 µW power consumption. The DC bias $V_{DC}$ is 4 V.

FIG. 5B illustrates a slight variation of FIG. 5A in which the PLL block 84 from FIG. 5A, is replaced by a voltage limiter 86, otherwise the circuits are the same and reflect the same reference numbering. It should also be appreciated that additional variations can be implemented without departing from the teachings of the present disclosure, such as utilizing a 1-bit ADC instead of the PLL block for achieving lower power consumption, or other circuitry without limitation as would be known to one of ordinary skill in the art.

A. Sensitivity and Offset

To demonstrate the effect of current chopping on the magnetometer's sensitivity and offset, a magnetometer was mounted inside a Helmholtz coil. A DC magnetic field ranging from −400 µT to 400 µT was then applied to the magnetometer for each data point.

Figure 6:
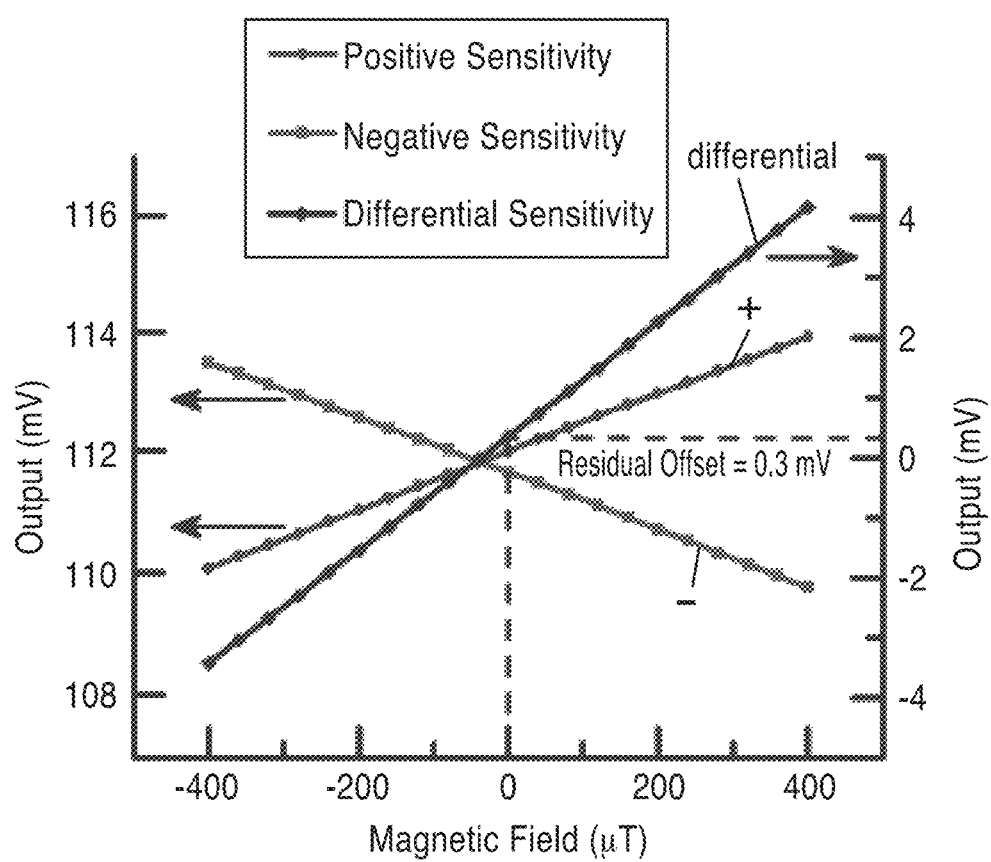
FIG. 6 is a plot of magnetometer sensitivity comparing positive, negative, and differential sensitivity according to at least one embodiment of the present disclosure.

FIG. 6 depicts sensitivity of the magnetometer under positive, negative and differential sensitivity conditions. The sensitivity of the magnetometer is measured first with $\varphi 1$ enabled and $\overline{\varphi 1}$ disabled, which results in a positive sensitivity in the magnetometer, with that plot marked as "+" in the figure. The measurement is repeated with $\overline{\varphi 1}$ enabled and $\varphi 1$ disabled, reversing the sign of sensitivity, with that plot marked as "−" in the figure. The offset in both cases is 112 mV, which is equivalent to a 25 mT offset.

The differential sensitivity, obtained by taking the difference between the two sensitivities before current chopping, is marked "differential" in the figure. Thus, it is seen that the chopper operation has resulting in suppressing the offset by a factor of 400 (400×) down to 0.3 mV (equivalent to a 31 µT offset).

The 0.3 mV residual offset results mainly from parasitic feedthrough capacitance in the MEMS resonator. Parasitic capacitances from electrodes IB+ and IB− to electrode S both generate feedthrough currents. If these capacitances are equal, the currents are equal and opposite, and no net current results. However, due to imperfections in device fabrication and wire-bonding, the resulting feedthrough current cannot be neglected and creates phase error in the oscillation loop. Each time the bias current reverses its sign, the feedthrough current also reverses its sign, creating phase error in the oscillation loop. Since the oscillation always occurs at the frequency where the phase shift around the loop is equal to 0°, the extra phase introduced by the feedthrough current shifts the oscillation frequency (and therefore the oscillation amplitude) of the MEMS resonator.

B. Offset Stability

To demonstrate that the current chopping method also reduces the long-term drift error, the magnetometer is placed in a magnetically-shielded environment without temperature regulation for long-term measurement. A thermocouple (e.g., NI-USBTC01, National Instruments®) with 0.1° C. resolution is mounted next to the magnetometer to measure the temperature.

Figure 7A:
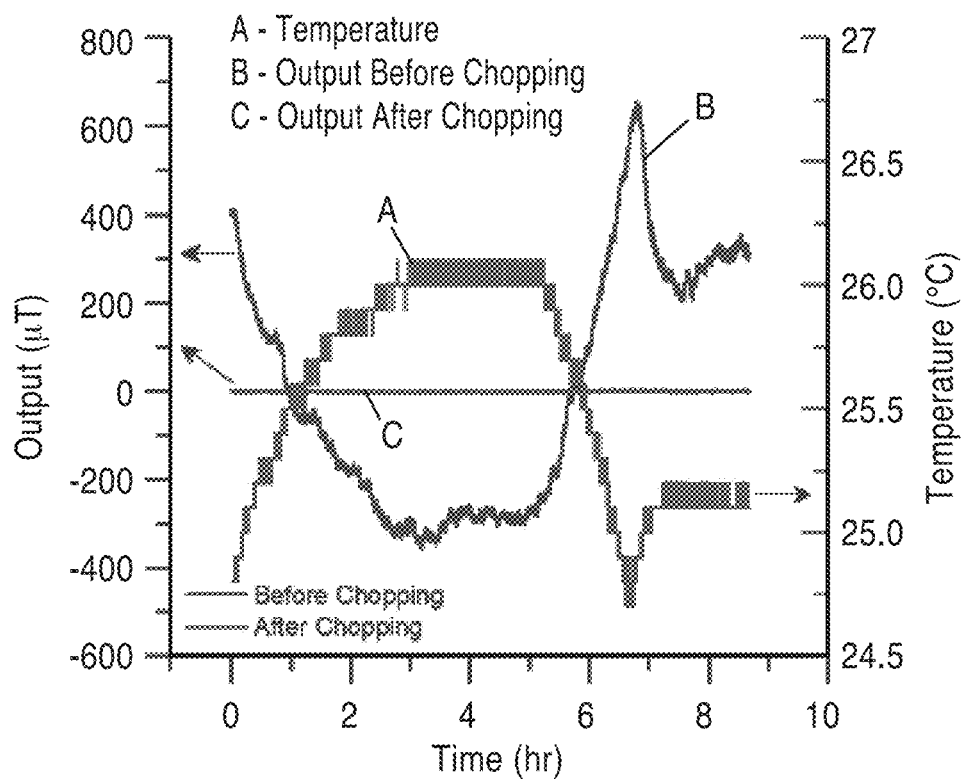
FIG. 7A and FIG. 7B are plots of long term magnetometer drift comparing before and after chopping according to at least one embodiment of the present disclosure.
Figure 7B:
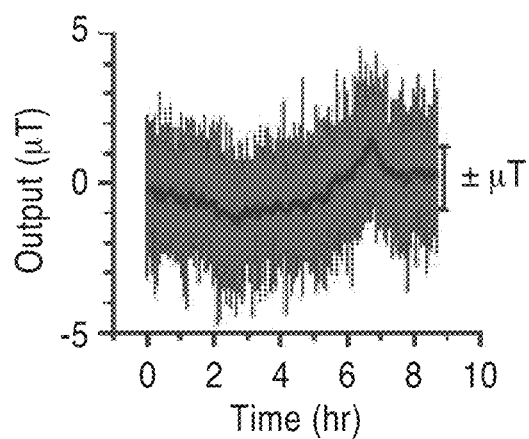

FIG. 7A and FIG. 7B depict a test of long term drift for the chopper stabilized magnetometer. In FIG. 7A is seen measured sensor offset over a 9-hour time period with the mean value subtracted. A temperature profile is depicted marked as curve "A" in the figure. Output before current chopping is depicted marked as curve "B" in the figure, while the output after chopping is seen marked as curve "C". The maximum drift error before current chopping is ±500 µT, which is reduced to ±1 µT after current chopping. Before current chopping, the offset of the magnetometer is strongly correlated to temperature change, which is mainly due to the quality factor (Q) dependence on temperature. This temperature effect is suppressed by the current chopping technique. FIG. 7B depicts a close-up view of the drift after chopping. The noise is 1 µT RMS, resulting from the sensor's 400 nT/√Hz noise density. The offset, averaged from 50 samples, varies by ±1 µT over 9 hrs.

Figure 8:
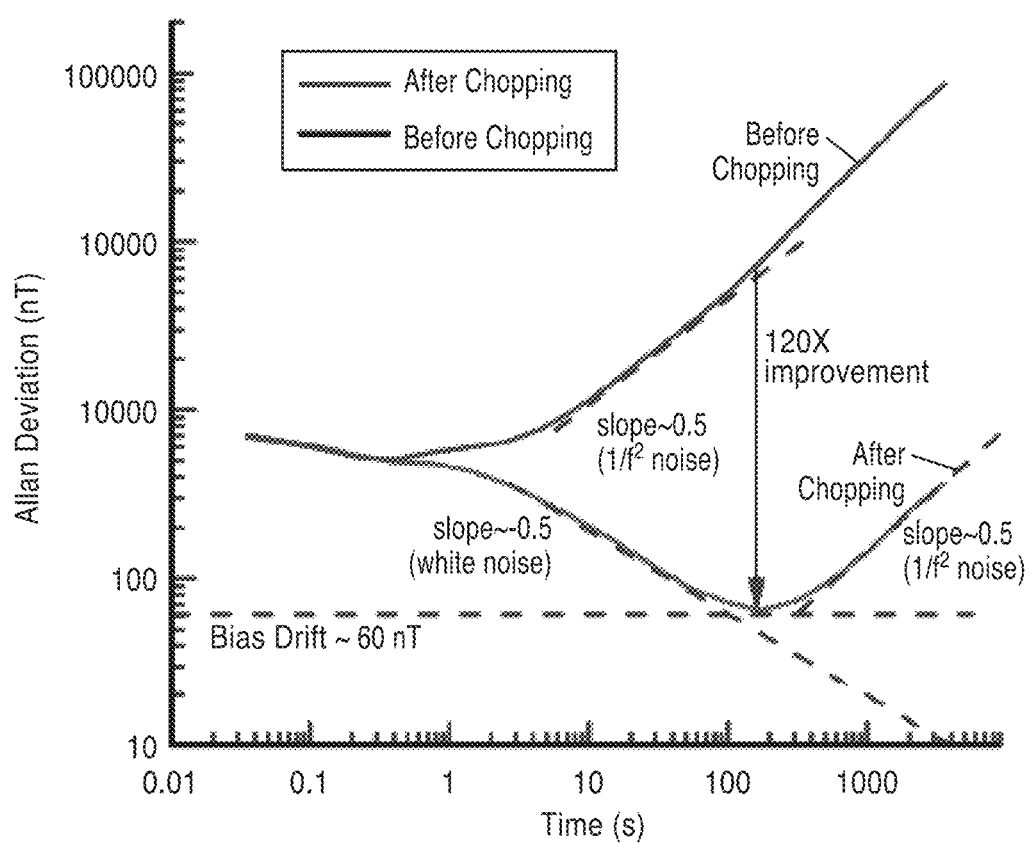
FIG. 8 is a plot of long term Allan deviation comparing before and after chopping according to at least one embodiment of the present disclosure.

FIG. 8 depicts quantifying long-term drift over a range of averaging times, with Allan deviation of the same data set shown before and after chopping. For averaging times shorter than 0.4 s, the magnetometer has the same short-term noise before and after chopping. At longer averaging times, the 1/f² noise (slope of about 0.5) dominates the output without chopping, whereas white noise (Brownian noise in this particular magnetometer) is still the dominant noise source for averaging times up to 100 s after chopping. A bias drift of 60 nT is achieved for 171 seconds averaging time. For longer averaging times, a slope of about 0.5 is also observed after chopping, which is due to the 31 µT residual offset. A fit of the white noise indicates that if the residual offset is reduced by a factor of 10, a bias drift of 10 nT may be achieved.

III. DISCUSSION

A. Noise Analysis

The current chopping technique discussed herein uses two pairs of choppers, which operate at a frequency substantially less than the natural frequency of the mechanical resonator, which normally ranges from 1 kHz to 100 kHz depending on the resonator design. This chopper removes the 1/f noise from the front-end capacitive sensing electronics and amplifies the signal from the magnetometer by Q. The chopper frequency normally ranges from approximately 1 Hz to 20 Hz, and more preferably from 1 Hz to 10 Hz.

Figure 9:
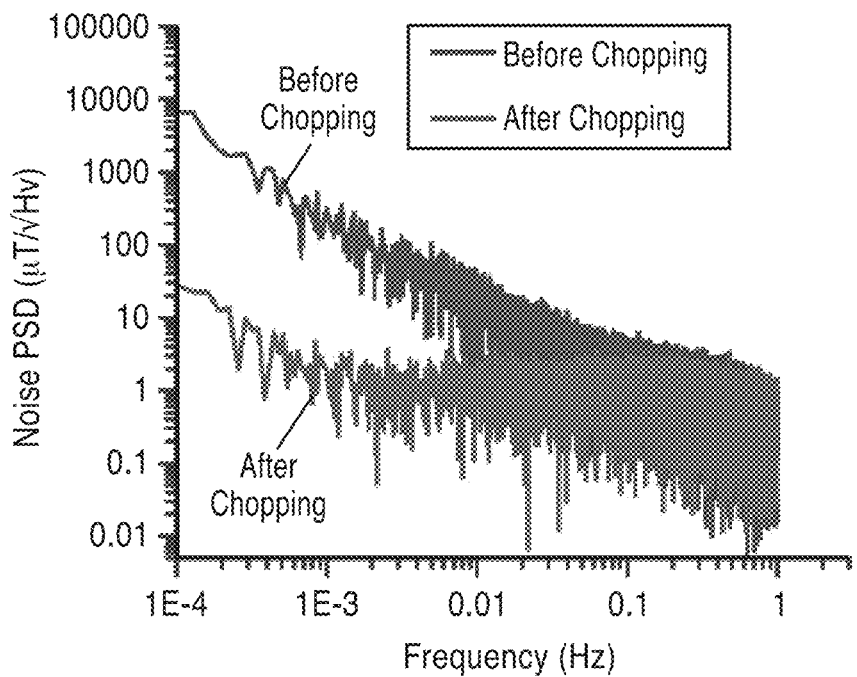
FIG. 9 is a plot of measured noise spectrum of the magnetic sensor comparing before and after chopping according to at least one embodiment of the present disclosure.

FIG. 9 depicts measured sensor noise before and after chopping.

The chopper suppresses the 1/f, 1/f² and 1/f³ noise terms from the mechanical resonator. This figure shows the result of fitting the measured Allan deviation using −0.5, 0, +0.5 and +1 slope lines and extracting Brownian noise, 1/f, 1/f² and 1/f³ noise components. The effect of chopping can be analyzed via the power spectral density (PSD) of each noise component. Because the sensor used in these experiments had a white noise spectrum that was dominated by mechanical thermal (Brownian) noise, the contribution of electronic thermal noise was neglected. So one readily sees the PSD noise difference before and after chopping.

Figure 10:
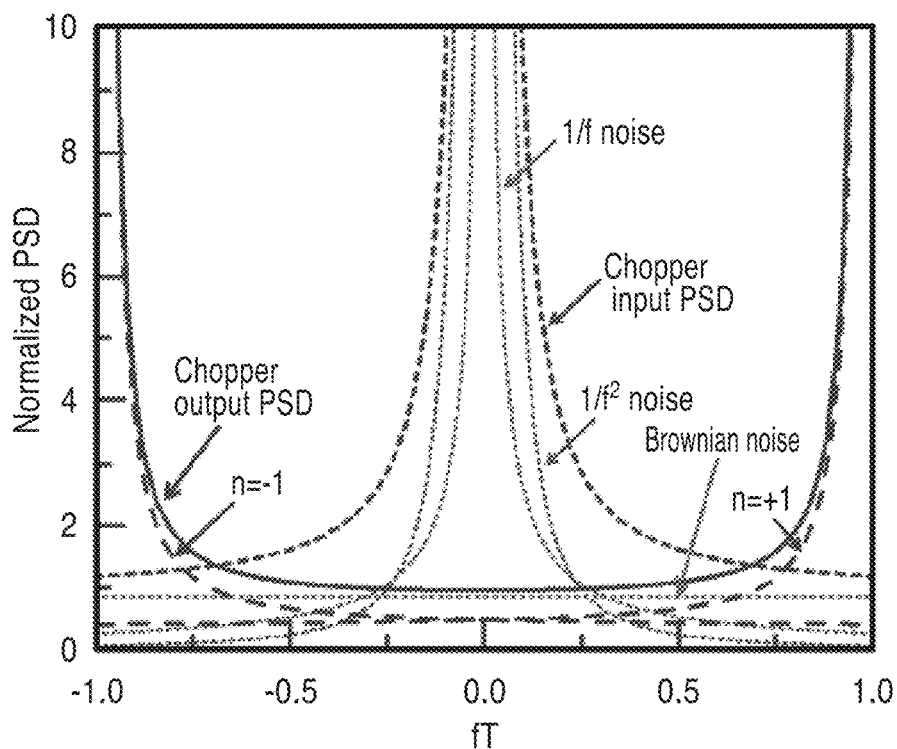
FIG. 10 is a plot of power spectral density of the magnetic sensor comparing before and after chopping according to at least one embodiment of the present disclosure.

FIG. 10 shows the chopper input PSD, $S_N(f)$, based on the fitted noise components. The chopped output PSD is given by:

$$S_c(f) = \left(\frac{2}{\pi}\right)^2 \sum_{\substack{n=-\infty \\ n: \text{odd}}}^{+\infty} \frac{1}{n^2} S_n\left(f - \frac{n}{T}\right) \quad (8)$$

where T is the chopping period, which is 1 s in this example measurement. From Eq. (8), it can be concluded that the noise floor after chopping is dominated by the n=±1 terms. The contribution of higher-order harmonics decreases drastically because of the n² term in the denominator. The n=±1 terms and chopper output PSD are also plotted in FIG. 10. It should be noted here that the 1/f³ noise term is not plotted in the figure because it is much smaller than the 1/f and 1/f² noise for |fT|≥0.01, and does not contribute to the bias drift (minimum Allan deviation). This conclusion is consistent with the Allan deviation plotted in FIG. 8. Before chopping, the 1/f³ noise starts to dominate the Allan deviation for averaging times greater than 200 s. However, after chopping, 1/f³ noise is not observed for averaging times up to 4000 s and the minimum Allan deviation is instead determined by 1/f² noise. Also the 1/f² noise is much lower than the 1/f noise for |fT|≥0.5 in FIG. 10. Therefore, the 1/f noise and Brownian noise components can be utilized to estimate the total residual noise in the chopped output PSD:

$$S_C \cong (1 + 0.8525 f_k T) \text{ for } |fT| \leq 0.5$$

where $S_0$ is the input white (Brownian) noise PSD and $f_k$ is the 1/f noise corner frequency, which is the frequency at which 1/f noise is equal to the white noise floor.

From the fitted value, $f_k$ is 0.3 Hz in the current setup. The chopped 1/f noise introduces approximately 0.27 $S_0$ white noise in the base band, which is equivalent to a 2 dB increase in the white noise floor. The modulation of 1/f noise and 1/f² noise can be further reduced by increasing the chopping frequency $f_c$, which would also increase the measurement bandwidth. However, larger $f_c$ requires a larger mechanical bandwidth from the MEMS resonator.

B. Residual Offset and Offset Stability

From Eq. (6) it is seen that sensitivity $S_x$ is independent of the offset $x_E$. When the magnetometer is operating in closed-loop, the offset $x_E$ can be set via different means: (1) The loop-gain is initially larger than 1 at the start of oscillation, but as $x_E$ increases, the motional impedance of the MEMS resonator also increases due to mechanical or electrical nonlinearity. Thus $x_E$ reaches its steady state when the loop-gain drops to 1. (2) An automatic level control (ALC) can be implemented to adjust the gain of oscillation loop by changing the gain in the detection electronics or by changing the DC bias on the MEMS resonator. (3) The oscillation amplitude can be clamped at a certain amplitude by using a hard-limiter or a 1-bit ADC before the MEMS resonator reaches its nonlinearity.

The first method is suitable for MEMS oscillators because it is desirable to have large oscillation amplitude to reduce phase noise. However, for Lorentz force magnetometers operating in closed-loop, operating the resonator in its non-linear region decreases the measurement range and stability. The second method is commonly used in modern MEMS oscillators and MEMS gyroscopes. The ALC is more predictable and more stable than the first method. It also provides a direct control of the oscillation amplitude. However, the ALC has greater power consumption, and also modulates 1/f noise back to the oscillation loop. In this work, a PLL is preferably utilized to lock to the natural frequency to minimize the phase error in the oscillation loop, and also to provide a convenient way to set the electrostatic oscillation amplitude $x_E$ by adjusting $V_{AC}$. Although one of ordinary skill in the art will appreciate that the PLL can be replaced by other circuits, including a hard-limiter or 1-bit ADC.

Figure 11:
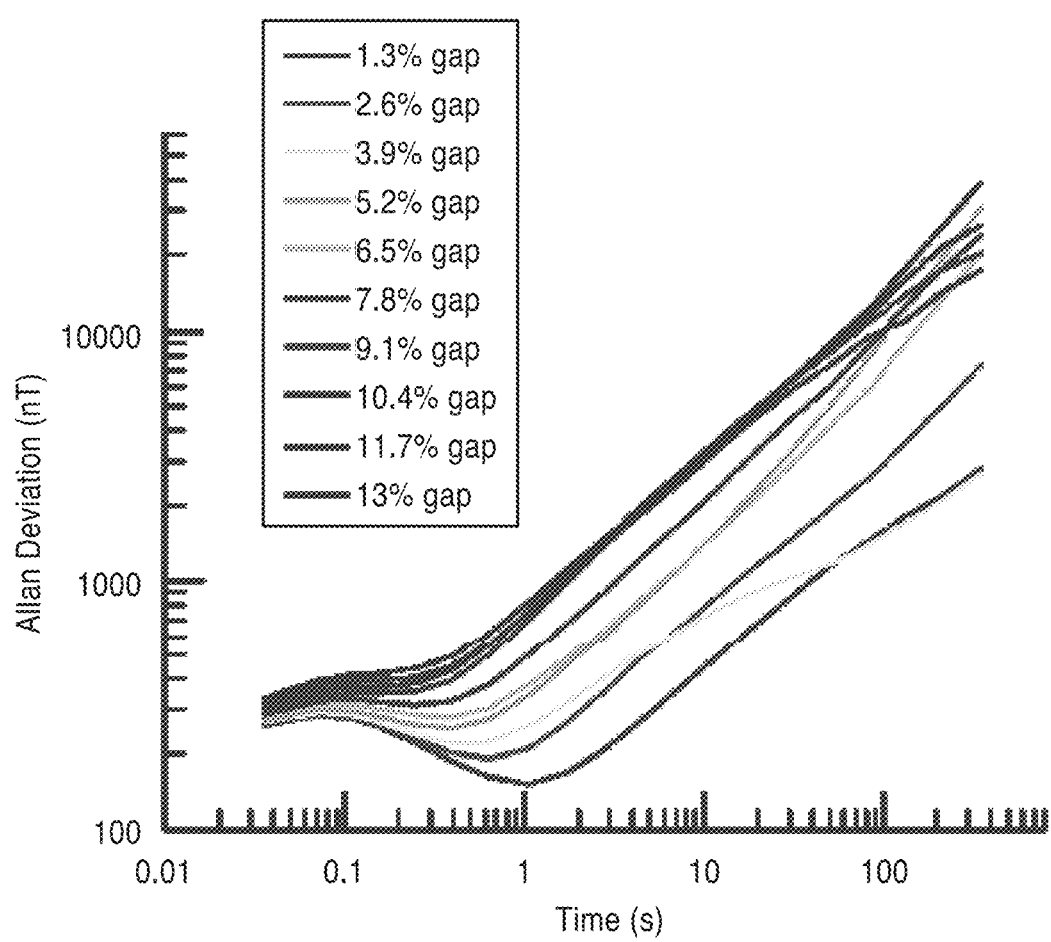
FIG. 11 is a plot of Allan deviation at various oscillation amplitudes of the magnetometer utilized according to at least one embodiment of the present disclosure.

FIG. 11 depicts Allan deviation for the magnetometer with various oscillation amplitudes by adjusting $V_{AC}$. To reduce the residual offset, both the offset $x_E$ and parasitic capacitance need to be decreased. The former can be easily achieved by reducing the oscillation amplitude set-point. The oscillation amplitude is adjusted linearly from 1.3% to 13% of the capacitive air gap. Bias current was not applied during this measurement, and the output voltage of the sensor was converted to an equivalent magnetic field strength using the previously measured-scale factor. It can be observed that 1/f and 1/f² noise increase linearly as the oscillation amplitude increases, indicating that the drift error of the magnetometer is a constant fraction of the oscillation amplitude. Some measurement error is observed for averaging times greater than 1 s, which is likely due to temperature fluctuations in the lab environment. Since increasing the oscillation amplitude does not improve magnetic sensitivity but does increase drift, FIG. 11 indicates that smaller oscillation amplitude helps to reduce residual offset and to improve the offset stability. However, extra care needs to be taken to ensure oscillation at smaller amplitude. Smaller amplitude makes the oscillation loop more sensitive to the phase error introduced by the capacitive feedthrough current. The residual offset can be further suppressed by removing the feedthrough signal due to the parasitic capacitance, which requires a more symmetric MEMS resonator design and feedthrough cancelling methods.

Table 1 compares the different types of magnetic sensors with offset suppressing methods. The Lorentz force magnetometer presented in this work achieves offset comparable to that of Hall effect sensors, however AMR and GMR sensors have been demonstrated with even lower offset. For a Lorentz force magnetometer to achieve the same residual offset and drift error as AMR and GMR sensors, the error resulting from feedthrough capacitance must be reduced to 1% of its present value using feedthrough cancellation and improved symmetry in the layout, as described above. As for resolution, many Lorentz force magnetometers have resolution ranging from 50 nT/$\sqrt{Hz}$ to 1000 nT/$\sqrt{Hz}$ with 1 mA bias current, which is comparable to, or even better than, that of Hall effect sensors. A Kyynäräinen's Lorenz force magnetometer achieved 1 nT/$\sqrt{Hz}$ resolution with 1 mA bias current, which is comparable to an AMR magnetometer. However, that device required extra fabrication steps to produce an electrically-isolated metal layer on top of the MEMS structure.

IV. OFFSET SUPPRESSION

Figure 12:
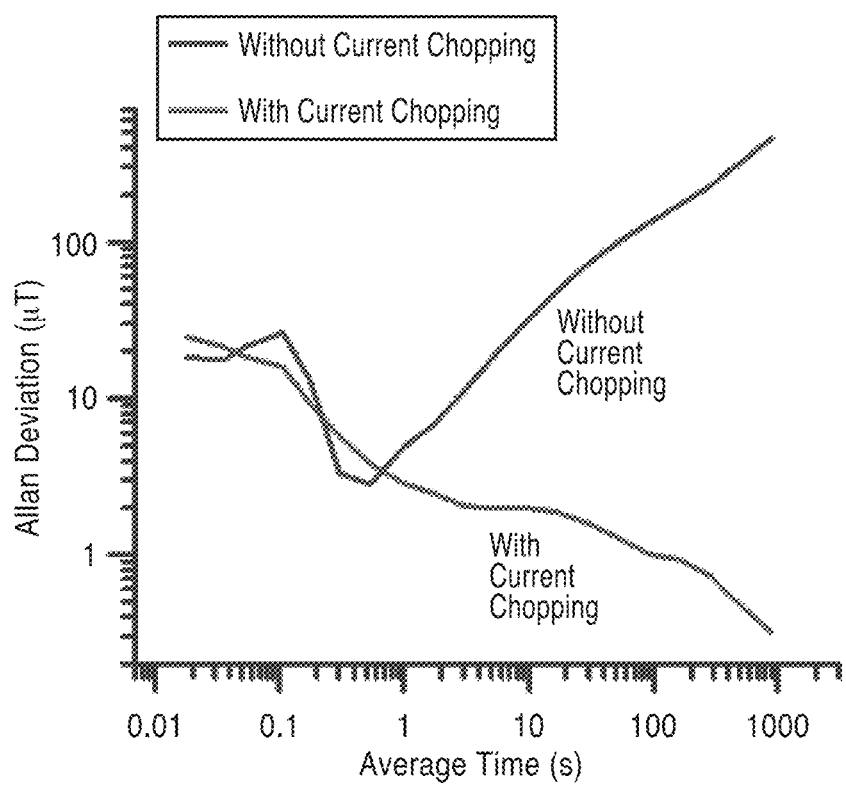
FIG. 12 is a plot of Allan deviation for measuring magnetometer frequency stability according to at least one embodiment of the present disclosure.
Figure 13:
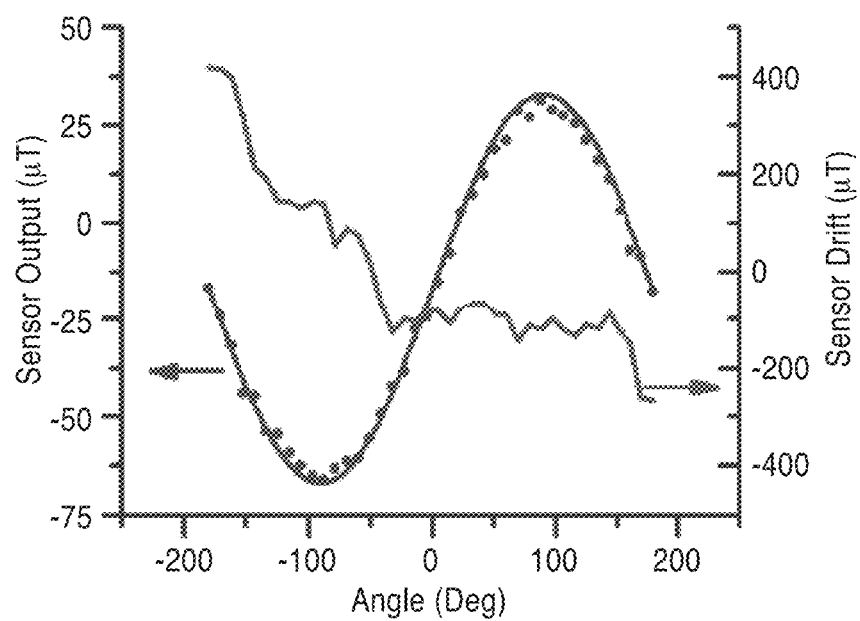
FIG. 13 is a plot of measured sensor output in relation to sensor drift during the measurement according to at least one embodiment of the present disclosure.

FIG. 12 and FIG. 13 depict results from a magnetometer as seen in FIG. 5 which is operated in FM mode. It should be recognized that FM mode is achieved by adding a 90° phase shift to element 76 of FIG. 5, whereas the other parts of that figure would remain the same.

FIG. 12 depicts Allan deviation used to measure frequency stability of the magnetometer. Without current chopping, the magnetometer has a minimum Allan deviation of 2.8 μT at 0.5 s averaging time. The minimum Allan deviation without current chopping is a few times higher than that of the same sensor operating in AM mode, mainly because the 1/f noise in the FM mode (where the 1/f corner frequency is 4 Hz) is much larger than that of the AM mode (where the 1/f corner frequency is 0.3 Hz). It is expected that the 1/f noise can be suppressed by increasing sensitivity of the magnetometer, thus improving frequency stability. The long-term drift of the magnetometer for averaging time longer than 0.5 s is mainly due to the temperature fluctuation and bias voltage drift, and can be suppressed by current chopping. With a chopping frequency of $f_c$=2 Hz, the long-term stability of the sensor is significantly improved because the chopping frequency modulates the magnetic field signal without modulating the offset.

Earth's magnetic field ranges from 10 μT to 100 μT. To demonstrate the capability of the sensor for measuring Earth's magnetic field as a compass, the sensor is placed in a 50 μT DC magnetic field generated by Helmholtz coils. The input magnetic field is rotated so that the angle between the bias current and the magnetic field changes 360°, and the sensor output is measured.

In FIG. 13, measured sensor output is depicted as a line through a sequence of dots. Current chopping is used to suppress the sensor drift, which is about 700 μT during the measurement. The sensor output shows the expected sin(θ) dependency with a −17 μT offset, of which −22 μT is contributed by the residual offset of current chopping, and the remaining 5 μT is from the stray field due to Earth's magnetic field and the unshielded test setup. As shown in the figure, the offset is similar in magnitude to the magnetic field of the Earth. However, a constant offset is typically subtracted from the sensor output to yield a calibrated field measurement; therefore, the important parameter is the instability of the offset (e.g. bias instability, as characterized via Allan deviation) rather than simply the magnitude of the offset.

V. CONCLUSION

An apparatus and method are disclosed to reduce the offset of Lorentz force magnetometers by chopping the bias current. The sensitivity is doubled whereas the drift error from the offset is suppressed. The method is verified with a single-axis Lorentz force magnetometer, and a 400× offset reduction is achieved. After current chopping, the magnetometer has an offset of 31 μT and a bias drift of 60 nT at a 171 s averaging time. The offset can be further reduced by decreasing the parasitic capacitance or with feedthrough compensation. These results demonstrate that Lorentz force magnetic sensors can achieve offset levels suitable for use in electronic compass applications.

From the description herein, it will be appreciated that that the present disclosure encompasses multiple embodiments which include, but are not limited to, the following:

1. An apparatus for magnetic force sensing, comprising: a Lorentz force magnetometer; a first oscillator configured for oscillating at a resonant flexural frequency of said Lorentz force magnetometer; a bias current signal generator configured for supplying a bias current through the resonator of said Lorentz force magnetometer modulated at said resonant flexural frequency of said Lorentz force magnetometer; a drive circuit for mixing said resonant flexural frequency of said Lorentz force magnetometer with an AC bias current signal to drive the drive input of said Lorentz force magnetometer in response to output from a sense output of said Lorentz force magnetometer; a second oscillator configured for oscillating at a chopping frequency; a first chopper circuit configured for reversing the polarity of bias current through said resonator at a chopping frequency output by said second oscillator; an amplifier coupled to the sense output from said Lorentz force magnetometer; a demodulator configured for receiving an amplified output from said amplifier and for demodulating that amplified output to remove said resonant flexural frequency of said Lorentz force magnetometer; and a second chopper circuit for restoring signal polarity output from said magnetometer, while being driven at said chopping frequency output by said second oscillator; wherein chopping of said bias current signal polarity modulates the magnetic field signal to a frequency whereby electrostatic force remains constant toward eliminating offset and long-term drift from said micromechanical resonator.

2. The apparatus of any preceding embodiment, wherein as bias current is supplied through the resonator in a first polarity electrostatic and Lorentz forces are in-phase, while supplying bias current in a second polarity results in electrostatic and Lorentz forces which are in opposite phases.

3. The apparatus of any preceding embodiment, wherein said first oscillator comprises an external oscillator configured with its frequency output set to the resonance frequency of the magnetometer to drive it in an open-loop mode.

4. The apparatus of any preceding embodiment, wherein said first oscillator comprises said magnetometer itself in an oscillator circuit to drive said magnetometer in a closed-loop mode.

5. The apparatus of any preceding embodiment, wherein said oscillator circuit includes a phase-locked loop circuit, voltage limiter or a 1 bit analog to digital converter (ADC).

6. The apparatus of any preceding embodiment, wherein said AC bias voltage signal is an inverse-cosine function of said resonant flexural frequency of said Lorentz force magnetometer, and adjusting said AC bias voltage signal sets electrostatic oscillation amplitude.

7. The apparatus of any preceding embodiment, wherein frequency of said chopping frequency is substantially lower than said AC bias current signal.

8. The apparatus of any preceding embodiment, wherein said chopping frequency is from a few Hz to approximately tens of Hz.

9. The apparatus of any preceding embodiment, wherein said Lorentz force magnetometer is a micro-electromechanical system (MEMS) device.

10. The apparatus of any preceding embodiment, wherein said apparatus for magnetic force sensing can be utilized in an electronic compasses for determination of heading and for navigation.

11. The apparatus of any preceding embodiment, further comprising a low-pass filter configured for filtering output from said demodulator prior to reaching said second chopping circuit.

12. The apparatus of any preceding embodiment, further comprising a low-pass filter configured for filtering output from said second chopping circuit before output from said apparatus.

13. An apparatus for magnetic force sensing, comprising: a Lorentz force magnetometer as a micro-electromechanical system (MEMS) device; a first oscillator configured for oscillating at a resonant flexural frequency of said Lorentz force magnetometer; a bias current signal generator configured for supplying a bias current through the resonator of said Lorentz force magnetometer modulated at said resonant flexural frequency of said Lorentz force magnetometer; a drive circuit for mixing said resonant flexural frequency of said Lorentz force magnetometer with an AC bias current signal to drive the drive input of said Lorentz force magnetometer in response to output from a sense output of said Lorentz force magnetometer; a second oscillator configured for oscillating at a chopping frequency; a first chopper circuit configured for reversing the polarity of bias current through said resonator at a chopping frequency output by said second oscillator; wherein as bias current is supplied through the resonator in a first polarity electrostatic and Lorentz forces are in-phase, while supplying bias current in a second polarity results in electrostatic and Lorentz forces which are in opposite phases; an amplifier coupled to the sense output from said Lorentz force magnetometer; a demodulator configured for receiving an amplified output from said amplifier and for demodulating that amplified output to remove said resonant flexural frequency of said Lorentz force magnetometer; a low-pass filter configured for filtering output from said demodulator; a second chopper circuit for restoring signal polarity output from said magnetometer, while being driven at said chopping frequency output by said second oscillator; a low-pass filter configured for filtering output from said second chopping circuit before output from said apparatus; wherein chopping of said bias current signal polarity modulates the magnetic field signal to a frequency whereby electrostatic force remains constant toward eliminating offset and long-term drift from said micromechanical resonator.

14. The apparatus of any preceding embodiment, wherein said first oscillator comprises an external oscillator configured with its frequency output set to the resonance frequency of the magnetometer to drive it in an open-loop mode.

15. The apparatus of any preceding embodiment, wherein said first oscillator comprises said magnetometer itself in an oscillator circuit to drive said magnetometer in a closed-loop mode.

16. The apparatus of any preceding embodiment, wherein said oscillator circuit includes a phase-locked loop circuit, voltage limiter or a 1 bit analog to digital converter (ADC).

17. The apparatus of any preceding embodiment, wherein said AC bias voltage signal is an inverse-cosine function of said resonant flexural frequency of said Lorentz force magnetometer, and adjusting said AC bias voltage signal sets electrostatic oscillation amplitude.

18. The apparatus of any preceding embodiment, wherein frequency of said chopping frequency is much lower than said AC bias current signal.

19. The apparatus of any preceding embodiment, wherein said apparatus for magnetic force sensing can be utilized in an electronic compasses for determination of heading and for navigation.

20. A method of magnetic force sensing, comprising: supplying a bias current through a resonator within a Lorentz force magnetometer, said bias current being modulated at a resonant flexural frequency of said Lorentz force magnetometer; mixing said resonant flexural frequency and an AC bias voltage signal to drive said Lorentz force magnetometer; chopping said bias current at a chopping frequency for periodically switching polarity of bias current applied through said resonator; amplifying output from said Lorentz force magnetometer; demodulating amplified output to remove said resonant flexural frequency of said Lorentz force magnetometer leaving only the magnetic sensing signal; and unchopping output after demodulating to restore signal polarity output from said magnetometer; wherein chopping of said bias current signal polarity modulates the magnetic field signal to a frequency whereby electrostatic force remains constant toward eliminating offset and long-term drift from said micromechanical resonator.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

In the claims, reference to an element in the singular is not intended to mean "one and only one" unless explicitly so stated, but rather "one or more." All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

TABLE 1

Comparison of Magnetic Sensors

| Sensor Type | Initial Offset | Suppress Method | Residual Offset | Drift Error |
|---|---|---|---|---|
| Hall Effect spinning-l-plate | 2-100 mT | Spinning Current | 250 µT | Not Reported |
| Hall Effect symmet.-plate | 10 mT | Orthogonal Switching | 10 µT | Not Reported |
| Hall Effect CMOS vertical | 2.42 ± 2 mT | Symm. Vert. Sensor | 0.06 ± 0.81 mT | Not Reported |
| AMR & GMR | 300 µT | AC Bias | 1 µT | ±10 nT/10 hr |
| Disclosure | 25 mT | Current Chopping | 31 µT | ±1 µT/9 hr |

What is claimed is:

1. An apparatus for magnetic force sensing, comprising:
a Lorentz force magnetometer;
a first oscillator configured for oscillating at a resonant flexural frequency of said Lorentz force magnetometer;
a bias current signal generator configured for supplying a bias current through a resonator of said Lorentz force magnetometer modulated at said resonant flexural frequency of said Lorentz force magnetometer;
a drive circuit for mixing said resonant flexural frequency of said Lorentz force magnetometer with an AC bias current signal to drive a drive input of said Lorentz force magnetometer in response to output from a sense output of said Lorentz force magnetometer;
a second oscillator configured for oscillating at a chopping frequency;
a first chopper circuit configured for reversing polarity of bias current through said resonator at a chopping frequency output by said second oscillator;
an amplifier coupled to the sense output from said Lorentz force magnetometer;
a demodulator configured for receiving an amplified output from said amplifier and for demodulating that amplified output to remove said resonant flexural frequency of said Lorentz force magnetometer; and
a second chopper circuit for restoring signal polarity output from said magnetometer, while being driven at said chopping frequency output by said second oscillator;
wherein chopping of said bias current signal polarity modulates a magnetic field signal to a frequency whereby electrostatic force remains constant toward eliminating offset and long-term drift from said micromechanical resonator.

2. The apparatus recited in claim 1, wherein as bias current is supplied through the resonator in a first polarity, electrostatic and Lorentz forces are in-phase, while supplying bias current in a second polarity results in electrostatic and Lorentz forces which are in opposite phases.

3. The apparatus recited in claim 1, wherein said first oscillator comprises an external oscillator configured with its frequency output set to the resonance frequency of the magnetometer to drive it in an open-loop mode.

4. The apparatus recited in claim 1, wherein said first oscillator comprises said magnetometer itself in an oscillator circuit to drive said magnetometer in a closed-loop mode.

5. The apparatus recited in claim 4, wherein said oscillator circuit includes a phase-locked loop circuit, voltage limiter or a 1 bit analog to digital converter (ADC).

6. The apparatus recited in claim 1, wherein said AC bias voltage signal is an inverse-cosine function of said resonant flexural frequency of said Lorentz force magnetometer, and adjusting said AC bias voltage signal sets electrostatic oscillation amplitude.

7. The apparatus recited in claim 6, wherein frequency of said chopping frequency is substantially lower than said AC bias current signal.

8. The apparatus recited in claim 7, wherein said chopping frequency is from a few Hz to approximately tens of Hz.

9. The apparatus recited in claim 1, wherein said Lorentz force magnetometer is a micro-electromechanical system (MEMS) device.

10. The apparatus recited in claim 1, wherein said apparatus for magnetic force sensing can be utilized in an electronic compasses for determination of heading and for navigation.

11. The apparatus recited in claim 1, further comprising a low-pass filter configured for filtering output from said demodulator prior to reaching said second chopping circuit.

12. The apparatus recited in claim 1, further comprising a low-pass filter configured for filtering output from said second chopping circuit before output from said apparatus.

13. An apparatus for magnetic force sensing, comprising:
a Lorentz force magnetometer as a micro-electromechanical system (MEMS) device;
a first oscillator configured for oscillating at a resonant flexural frequency of said Lorentz force magnetometer;
a bias current signal generator configured for supplying a bias current through a resonator of said Lorentz force magnetometer modulated at said resonant flexural frequency of said Lorentz force magnetometer;
a drive circuit for mixing said resonant flexural frequency of said Lorentz force magnetometer with an AC bias current signal to drive a drive input of said Lorentz force magnetometer in response to output from a sense output of said Lorentz force magnetometer;
a second oscillator configured for oscillating at a chopping frequency;
a first chopper circuit configured for reversing polarity of bias current through said resonator at a chopping frequency output by said second oscillator;
wherein as bias current is supplied through the resonator in a first polarity electrostatic and Lorentz forces are in-phase, while supplying bias current in a second polarity results in electrostatic and Lorentz forces which are in opposite phases;
an amplifier coupled to the sense output from said Lorentz force magnetometer;
a demodulator configured for receiving an amplified output from said amplifier and for demodulating that amplified output to remove said resonant flexural frequency of said Lorentz force magnetometer;
a low-pass filter configured for filtering output from said demodulator;
a second chopper circuit for restoring signal polarity output from said magnetometer, while being driven at said chopping frequency output by said second oscillator; and
a low-pass filter configured for filtering output from said second chopping circuit;
wherein chopping of said bias current signal polarity modulates a magnetic field signal to a frequency whereby electrostatic force remains constant toward eliminating offset and long-term drift from said micromechanical resonator.

14. The apparatus recited in claim 13, wherein said first oscillator comprises an external oscillator configured with its frequency output set to the resonance frequency of the magnetometer to drive it in an open-loop mode.

15. The apparatus recited in claim 13, wherein said first oscillator comprises said magnetometer itself in an oscillator circuit to drive said magnetometer in a closed-loop mode.

16. The apparatus recited in claim 15, wherein said oscillator circuit includes a phase-locked loop circuit, voltage limiter or a 1 bit analog to digital converter (ADC).

17. The apparatus recited in claim 13, wherein said AC bias voltage signal is an inverse-cosine function of said resonant flexural frequency of said Lorentz force magnetometer, and adjusting said AC bias voltage signal sets electrostatic oscillation amplitude.

18. The apparatus recited in claim 17, wherein frequency of said chopping frequency is much lower than said AC bias current signal.

19. The apparatus recited in claim 13, wherein said apparatus for magnetic force sensing can be utilized in an electronic compasses for determination of heading and for navigation.

20. A method of magnetic force sensing, comprising:
supplying a bias current through a resonator within a Lorentz force magnetometer, said bias current being modulated at a resonant flexural frequency of said Lorentz force magnetometer;
mixing said resonant flexural frequency and an AC bias voltage signal to drive said Lorentz force magnetometer;
chopping said bias current at a chopping frequency for periodically switching polarity of bias current applied through said resonator;
amplifying output from said Lorentz force magnetometer;
demodulating amplified output to remove said resonant flexural frequency of said Lorentz force magnetometer leaving only a magnetic sensing signal; and
unchopping output after demodulating to restore signal polarity output from said magnetometer;
wherein chopping of said bias current signal polarity modulates a magnetic field signal to a frequency whereby electrostatic force remains constant toward eliminating offset and long-term drift from said micromechanical resonator.

* * * * *